US006372672B1

(12) United States Patent
Kim et al.

(10) Patent No.: US 6,372,672 B1
(45) Date of Patent: Apr. 16, 2002

(54) METHOD OF FORMING A SILICON NITRIDE LAYER IN A SEMICONDUCTOR DEVICE

(75) Inventors: Do-Hyung Kim, Seoul; Ju-Bum Lee, Kyunggi-do, both of (KR); Byung-Keun Hwang, Midland, MI (US)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/478,064

(22) Filed: Jan. 5, 2000

(30) Foreign Application Priority Data

Jan. 5, 1999 (KR) .................................................. 9963

(51) Int. Cl.[7] ................................................ H01L 21/31

(52) U.S. Cl. ........................................ 438/791; 438/792

(58) Field of Search .................................. 438/791, 792

(56) References Cited

U.S. PATENT DOCUMENTS 4,563,367 A * 1/1986 Sherman ...................... 427/39
5,731,238 A * 3/1998 Cavins et al. ............... 438/261

* cited by examiner

*Primary Examiner*—John F. Niebling
*Assistant Examiner*—David A. Zarneke
(74) *Attorney, Agent, or Firm*—Marger Jhonson & McCollom, P.C.

(57) ABSTRACT

A method of forming a silicon nitride layer in a semiconductor device manufacturing process. The silicon nitride layer ($Si_xN_yH_z$) is formed by PE-CVD technique at low temperature to have at most 0.35 hydrogen composition. The resulting silicon nitride layer has substantially no Si—H bonding as compared with a silicon nitride layer formed at high temperature, thereby reducing thermal stress variation during annealing. The resulting silicon nitride layer exhibits reduced thermal stress variation before and after deposition, preventing a popping phenomenon and reducing the stress applied to the underlying layer.

20 Claims, 10 Drawing Sheets

METHOD OF FORMING A SILICON NITRIDE LAYER IN A SEMICONDUCTOR DEVICE

BACKGROUND OF THE INVENTION

1. Field of the Invention

The present invention relates to a semiconductor manufacturing, and, more particularly, to a method of forming a PE-CVD silicon nitride layer which exhibits good stress characteristics during a thermal process.

2. Description of the Related Art

A silicon nitride (SiN) film has been widely used as a passivation film or interlayer insulating film of integrated circuits. FIGS. 1A to 1F schematically shows a method of forming a gate electrode with a low pressure (LP)-SiN capping layer, at selected stages according to the prior art. A gate oxide layer (not shown) is formed on a semiconductor substrate 2. A gate electrode polysilicon 4 and a tungsten silicide 6 are deposited on the gate oxide layer as shown in FIG. 1B. A gate mask LP-SiN 8, an oxide layer 10 and an anti-reflection layer (not shown) are formed on the gate electrode as shown in FIGS. 1C and 1D.

Referring to FIG. 1E, a photoresist pattern 12 is formed on the anti-reflection layer. Using the photoresist pattern 12 as an etching mask, underlying anti-reflection layer, oxide layer 10 and LP SiN layer 8 are etched. Then, the photoresist pattern 12 is removed. Using the etched LP SiN layer as an etching mask, the underlying tungsten silicide 6 and polysilicon 4 are etched to form a gate 14 as shown in FIG. 1F. Subsequently, an annealing process is carried out so as to prevent hump generation on the sidewalls of the tungsten silicide during the gate spacer deposition process—particularly this process is high temperature oxide (HTO) deposition. Subsequently, a gate poly oxidation process is carried out. In turn, an insulating spacer made of HTO or LP-SiN is formed on a sidewall of the gate 14.

As the degree of the integration density of the integrated circuit device increases, word lines and bit lines are made of titanium silicide or tungsten instead of tungsten silicide for improving device operation speed. This is because the titanium silicide and tungsten have lower resistivity than the tungsten silicide. However, there are some problems with the use of titanium silicide and tungsten in a gate electrode application. For example, gate mask LP-SiN and HTO are formed at high temperatures and such high deposition temperatures put a thermal budget on the titanium silicide and tungsten, thereby transforming the titanium silicide (e.g., titanium silicide layer partially agglomerates to form an iceberg-like region) and tungsten. As a result, when titanium silicide gate electrode layer is etched by using the overlying LP-SiN as a mask, the titanium silicide layer is selectively and partially etched.

As a result, after etching the gate electrode of polysilicon and titanium silicide, a gate electrode residue can remain on the semiconductor substrate where the gate electrode is not to be formed and a part of the semiconductor substrate can be etched to cause a pitting phenomenon.

In order to overcome the above-mentioned problems, the LP-SiN mask can be replaced by a PE-SiN layer, which can be formed at relatively lower temperatures, putting a smaller thermal budget on the underlying gate electrode. However, the PE-SiN has some problems with "a lifting phenomenon" from the underlying gate electrode. Such lifting phenomenon, for example, can be generated on the undercut region between the gate electrode and the mask PE-SiN following subsequent cleaning processes.

Another problem with conventional PE-SiN is a "popping phenomenon" of the PE-SiN (see reference number 20 of FIG. 2) caused by stress variation during hump treatment annealing process and the gate poly oxidation process. Reference number 20 represents the region where the PE-SiN layer is formed. As can be seen, popping of the PE-SiN exposes the underlying layer here and there. Reference number 21 indicates popping residues of the PE-SiN are scattered on the region adjacent to the PE-SiN formed region. Such popping phenomenon can block subsequent processes.

FIG. 3 schematically shows the relationship between stress and annealing temperature of the conventional PE-SiN. In FIG. 3, reference number 126 indicates a stress versus annealing temperature, and reference number 128 indicates a stress versus cooling following annealing. As can be seen, when annealing temperature is about 400° C., compressive stress begins to change into tensile stress, and the tensile stress significantly increases with increases in temperature. When temperature is about 850° C., the tensile stress becomes about 1.00E+10 dyne/$cm^2$. As the temperature decreases after annealing, the tensile stress begins to change (i.e., increases) at about 650° C. and becomes about 1.30E+10 dyne/$cm^2$ at about 550° C. The stress varies significantly with respect to annealing temperature and furthermore the stress variation (ΔS1) during and after annealing is very large. Such stress characteristics cause a popping phenomenon.

Accordingly, there is a need for a method of forming a silicon nitride that has a low stress variation during annealing and a low stress variation between during and after annealing.

SUMMARY OF THE INVENTION

The present invention was made in view of the above-mentioned problems and therefore is directed toward providing a method of forming a silicon nitride layer that can reduce stress variation during annealing process. The silicon nitride is formed in a controlled manner by a plasma enhanced chemical vapour deposition (PECVD) technique as to reduce hydrogen content, for example, to have hydrogen composition of about 0.35 or less. PECVD technique uses a silicon source gas selected from the group consisting of $SiH_4$, $Si_2H_2Cl_2$, and combinations thereof, uses a nitride source gas selected from the group consisting of $NH_3$, $N_2$, and combinations thereof. For example, PECVD technique uses a mixed gas containing $SiH_4$, $NH_3$ and $N_2$, and the ratio of $SiH_4$:$NH_3$ is in the range of about 2:1 to 1:3 when $SiH_4$ is flowed at a rate of about 35 sccm to 60 sccm. The PECVD technique is carried out at a power of about 300 watt to 800 watt, at a pressure of about 5 torr to 7 torr, at a temperature of about 300° C. to 600° C.

In accordance with the present invention, there is provided a method of forming a silicon nitride layer($Si_xN_yH_z$) on a semiconductor topology in a semiconductor device, wherein a silicon nitride layer is formed by a plasma enhanced chemical vapor deposition(PE-CVD) technique to reduce a stress variation during an annealing process by adjusting hydrogen composition(z) of the silicon nitride layer to a predetermined value. The hydrogen composition preferably is at most 0.35.

In accordance with one aspect of the present invention, the semiconductor topology includes a semiconductor substrate and a material layer formed thereon, and wherein the silicon nitride layer and the underlying material layer are etched to define a gate electrode structure. The material layer is made of one selected from a group consisting of a refractory metal, a refractory metal silicide and refractor metal nitride. Refractory metal includes a tungsten, tantalum, molybdenum, titanium and cobalt, refractory metal silicide includes tungsten silicide, tantalum silicide, molybdenum silicide, titanium silicide and cobalt silicide, and the refractory metal nitride includes tungsten nitride, tantalum nitride and titanium nitride. An oxide layer may be further formed on the silicon nitride layer. Oxide layer may be made of one selected from a group consisting of high temperature oxide (HTO), PE-$SiH_4$ and PE-tetraethylorthosilicate (TEOS). An insulating spacer may be further formed on sidewalls of the etched material and silicon nitride layers. The insulating spacer is made of a PECVD silicon nitride layer having a hydrogen composition of at most 0.35.

In accordance with another aspect of the present invention, the semiconductor topology includes a semiconductor substrate and a pad oxide layer thereon, and wherein the silicon nitride layer, the pad oxide layer and the semiconductor substrate are etched to define a trench in the semiconductor substrate for device isolation. A second silicon nitride layer may be further formed on the trench interior. The second silicon nitride layer is formed by an LPCVD(low pressure chemical vapor deposition) technique.

BRIEF DESCRIPTION OF THE DRAWINGS

The above features and advantages of the invention will become apparent upon reference to the following detailed description of specific embodiments and the attached drawings, of which.

DETAILED DESCRIPTION OF THE PREFERRED EMBODIMENTS

Figure 1A:
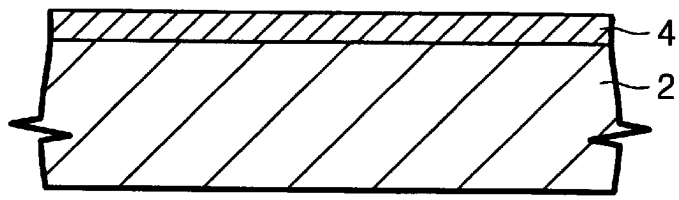
FIGS. 1A to 1F are cross-sectional views of a semiconductor substrate, at selected stages of a method of forming a gate electrode with a conventional LP-SiN according to the prior art.
Figure 1B:
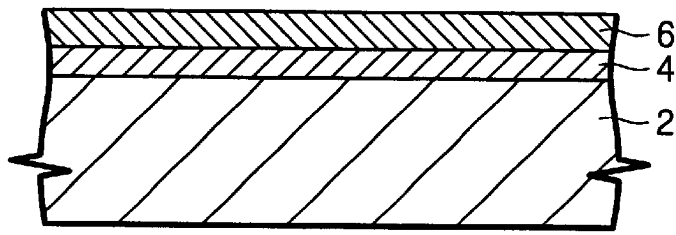
Figure 1C:
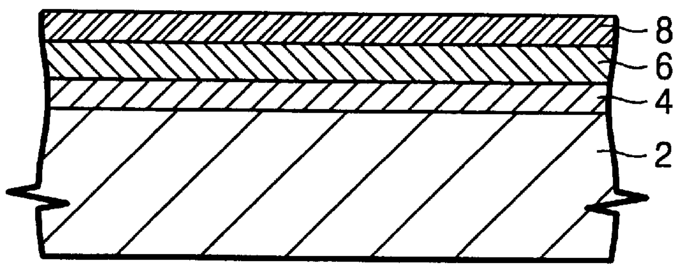
Figure 1D:
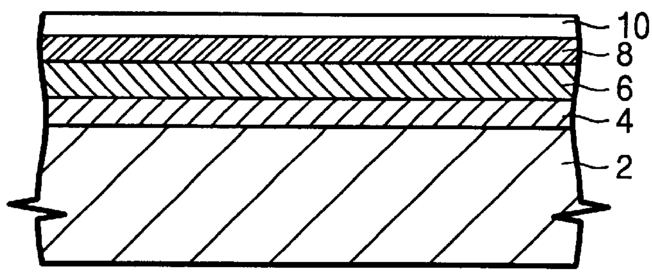
Figure 1E:
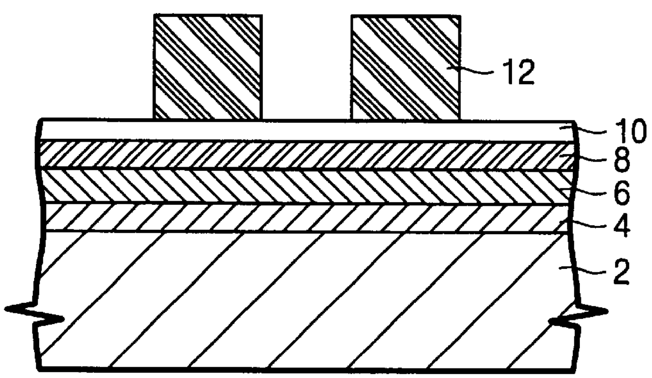
Figure 1F:
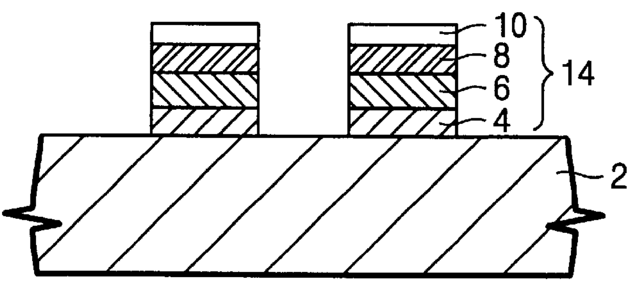
Figure 2:
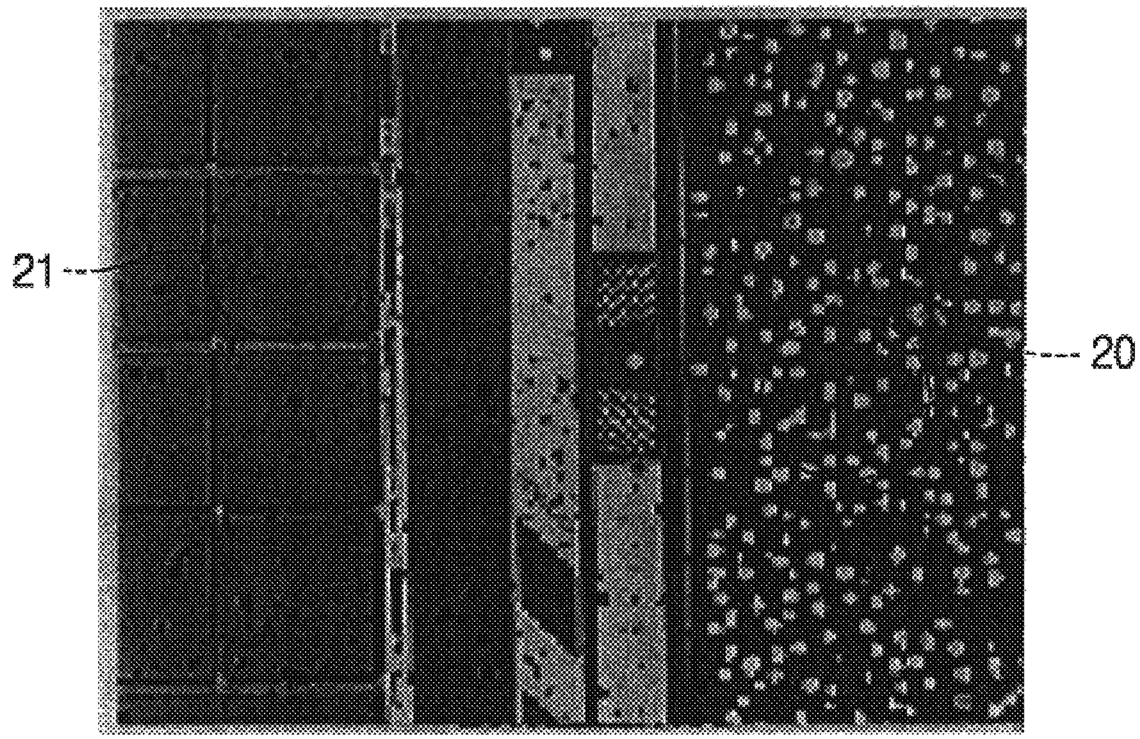
FIG. 2 is a photograph schematically illustrating a popping phenomenon of PE-SiN.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being “on” another layer or substrate, it can be directly on the other layer or substrate or intervening layers may also be present. Moreover, each embodiment described and illustrated herein includes its complementary conductivity type embodiment as well.

Figure 4A:
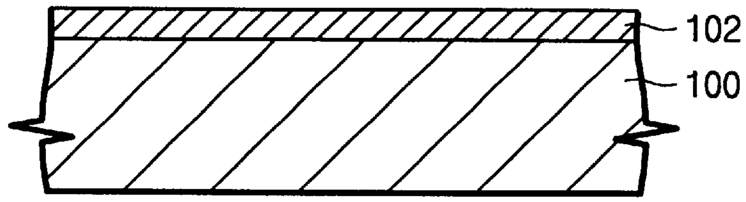
FIGS. 4A to 4F are cross-sectional views of a semiconductor substrate, at selected stages of a method of forming a gate electrode with a novel PE-SiN layer in accordance with the present invention.
Figure 4B:
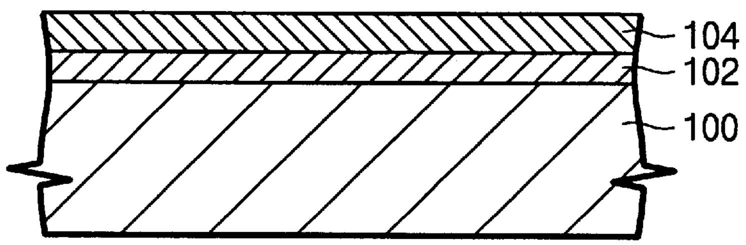
Figure 4C:
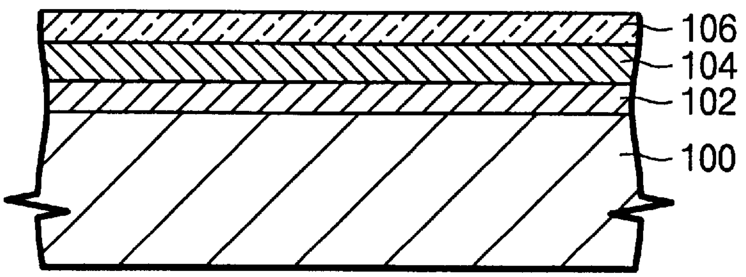

FIGS. 4A to 4F are cross-sectional views of a semiconductor substrate, at selected stages of a method of forming a gate electrode using novel PE-SiN layer according to a first embodiment of the present invention. Referring now to FIGS. 4A and 4B, a semiconductor substrate 100 is provided and a gate oxide layer(not shown for drawing simplicity) is formed thereon. The gate oxide layer may be formed of silicon oxide or nitride oxide. Gate electrode layers 102 and 104 are formed on the gate oxide layer.

More particularly, a polysilicon electrode 102 and a low resistance conductive layer 104 are formed. The low resistance conductive layer 104 may be made of a refractory metal, a refractory metal silicide, a refractory metal nitride, or the like. The refractory metal may include tungsten, tantalum, molybdenum, titanium, cobalt, or the like. The refractor metal silicide may include tungsten silicide, tantalum silicide, molybdenum silicide, titanum silicide, cobalt silicide, or the like. The refractory metal nitride may include tungsten nitride, tantalum nitride, titanum nitride, or the like.

The next process step is the formation of nitride mask layer on the low resistance conductive layer 104. The PECVD silicon nitride layer conventionally uses $SiH_4$ and $Si_2H_2Cl_2$ as a silicon source gas and $NH_3$ and $N_2$ as a nitride source gas. The silicon or nitride source gas contains hydrogen and thus the resulting PECVD silicon nitride layer contains a hydrogen composition as Si-H bonding which causes problems previously mentioned.

The present invention forms a PECVD silicon nitride layer 106, at a low temperature, which contains a hydrogen composition below a predetermined level, i.e., 0.35 or less, preferably 0.25 or less. More particularly, the PECVD silicon nitride layer of the present invention is formed by using a source gas $SiH_4$, $NH_3$ and $N_2$. The $SiH_4$ has a flow rate of about 20 sccm to 100 sccm, $NH_3$ has a flow rate of about 20 sccm to 300 sccm, and $N_2$ has a flow rate of about 1,000 sccm to 6,000 sccm. Preferably, $SiH_4$ has a flow rate of 60 sccm or less, for example about 45 sccm, $NH_3$ has a flow rate of about 45 sccm or less, and $N_2$ has a flow rate of about 5,000 sccm. When $SiH_4$ has a flow rate of 60 sccm or less, the ratio of $SiH_4$ and $NH_3$ is in the range of about 2:1 to 1:3.

A reacting chamber has a power of about 300 watt to 800 watt, preferably 400 watt to 500 watt, has a pressure of about 5 torr to 7 torr, preferably 6 torr, has a temperature of about 300° C. to 600° C., preferably 400° C. to 550° C. It is noted that $SiH_4$ has reduced gas flow as compared to the prior art (about 300 sccm). The deposition rate of silicon nitride layer is 1,500 angstroms/min or less, preferably 1,100 angstroms/min.

The resulting silicon nitride layer is $Si_3N_{3.75}H_{0.25}$. Conventional PE-SiN layer has hydrogen composition of greater than 0.35, for example, $Si_3N_{3.33}H_{0.67}$. An LP-SiN layer is formed at a temperature more than 700° C. and thus source gases are completely dissociated to form $Si_3N_4$. The silicon nitride layer of the present invention has a reduced hydrogen composition as compared to the prior art.

Figure 4D:
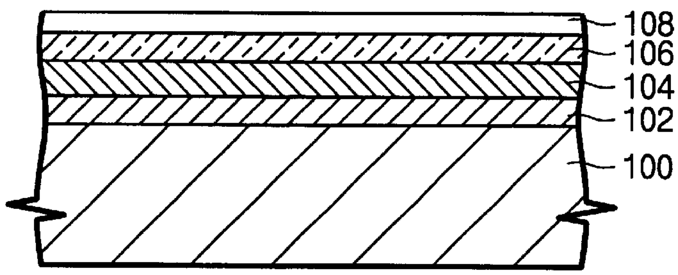
Figure 4E:
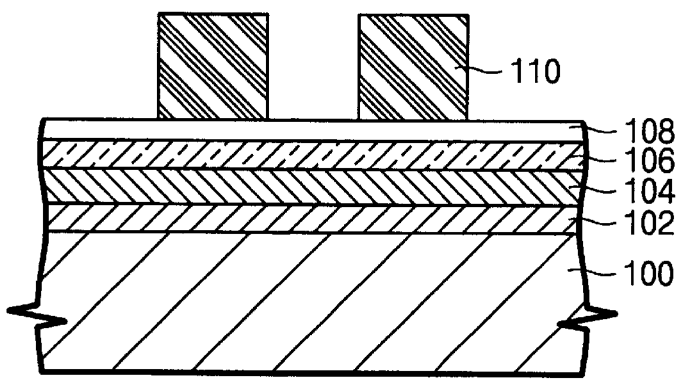
Figure 4F:
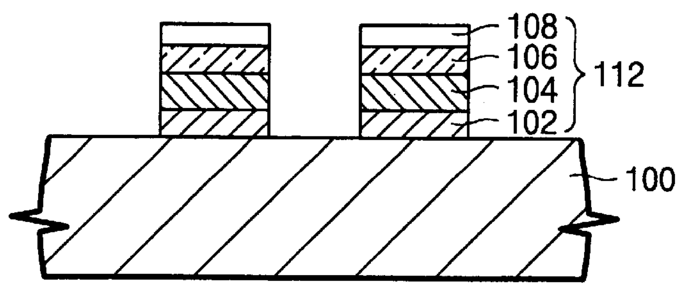

Referring now to FIG. 4D, an oxide layer 108 is formed on the PE-SiN layer 104. The oxide layer 108 may be one of HTO(high temperature oxide), PE-$SiH_4$ oxide and PE-TEOS oxide. An anti-reflection coating layer is formed on the oxide layer 108. A photoresist layer is spin coated and patterned into a predetermined configuration, i.e., a photoresist pattern 110 defining a gate electrode pattern. Using the photoresist pattern 105 as a mask, the anti-reflection coating layer, oxide layer 108 and the silicon nitride layer 106 are etched to form a nitride mask. After removing the photoresist pattern 105, the gate electrode layers 104 and 102 and the gate oxide are etched by using the silicon nitride mask to form gate electrode structures 112 as shown in FIG. 4F.

Subsequently, as in the prior art, hump annealing and gate poly oxidation processes are carried out at a temperature of about 650° C. and 900° C., respectively. A sidewall spacer is formed on sidewalls of the gate electrode structure. The sidewall spacer is made of an insulating material, with good step coverage, such as HTO and LP-SiN. Alternatively, the sidewall spacer can be formed by PE-SiN through the above mentioned method.

Figure 5:
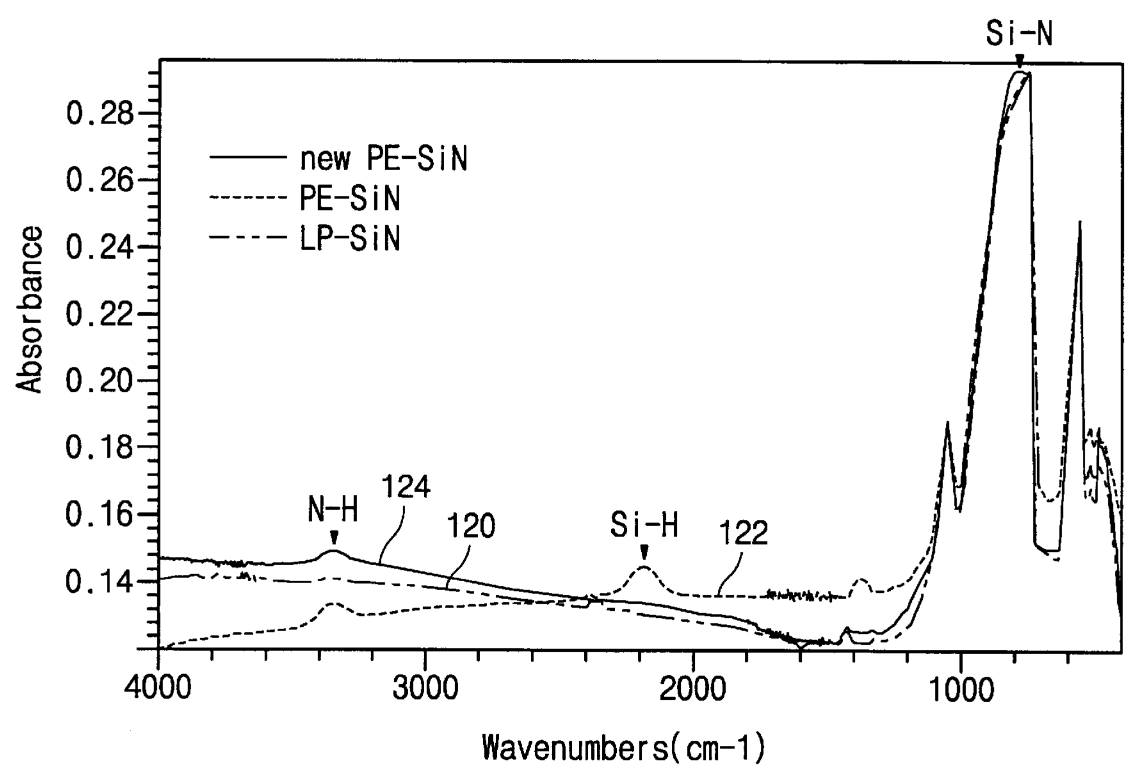
FIG. 5 is a fourier transform infrared spectroscopy (FTIR) graph of SiN layer.

FIG. 5 is an FTIR graph of various SiN layers. In FIG. 5, reference number 120 denotes an LP-SiN layer, reference number 122 denotes a conventional PE-SiN layer, and reference number 124 denotes a novel PE-SiN layer in accordance with the present invention. Conventional PE-SiN layer 122 has Si—H bonding but novel PE-SiN layer 124 of the present invention has substantially no Si—H bonding. LP-SiN layer 120 has also no Si—H bonding but it is formed at high temperature putting a thermal budget the underlying structure.

Figure 6:
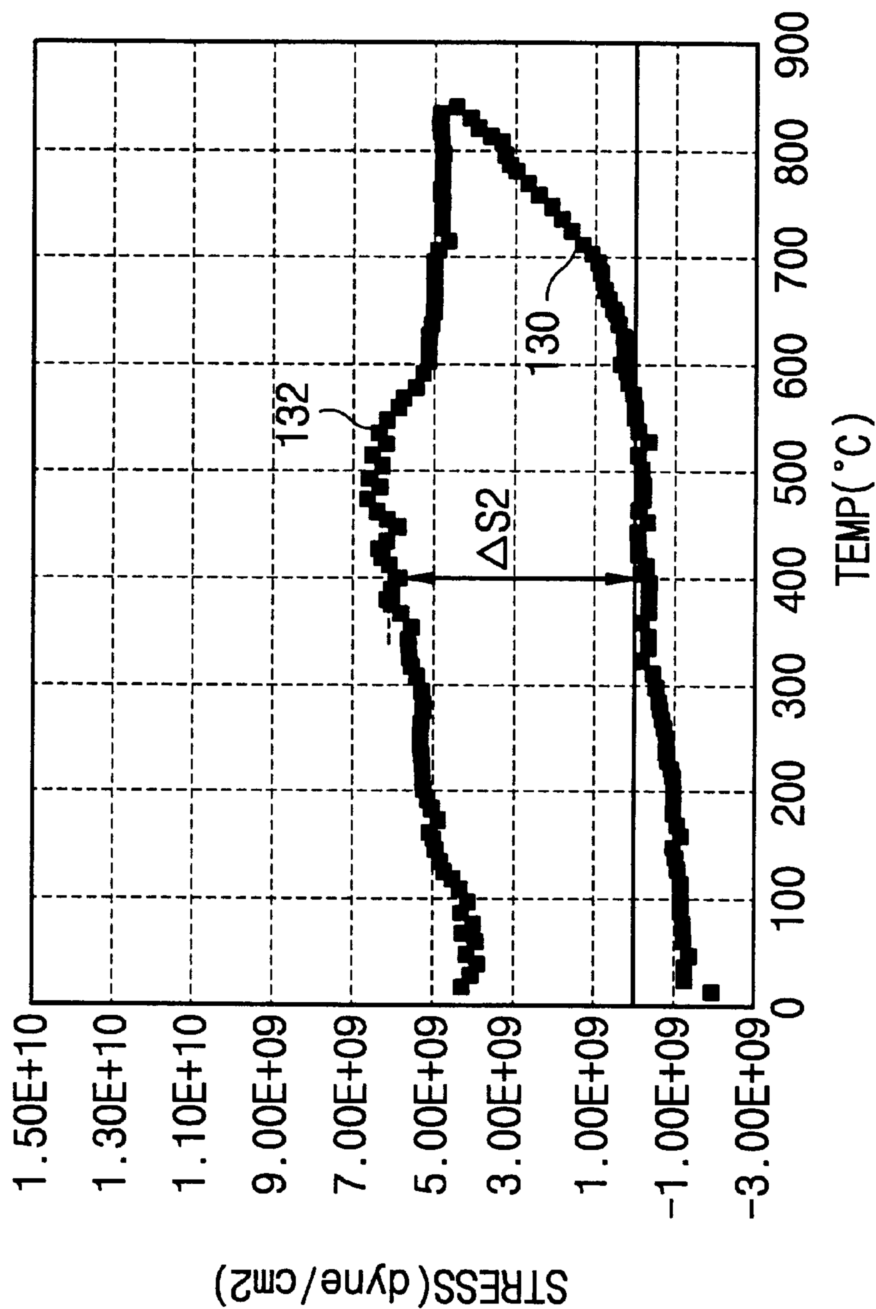
FIG. 6 schematically shows the stress variation of the novel PE-SiN layer as a function of an annealing temperature in accordance with the present invention.

FIG. 6 shows the relationship between the stress and the annealing temperatures of the PE-SiN of the present invention. In FIG. 6, reference number 130 indicates stress versus annealing temperature and reference number 132 indicates stress versus cooling following annealing. As can be seen, when the annealing temperature is about 500° C., compressive stress begins to change into tensile stress, and the tensile stress increases gradually with increases in temperature (compare to reference number 126 of FIG. 3). When the temperature is about 850° C., the tensile stress becomes about 5.00E+09 dyne/$cm^2$ which is very small as compared to conventional 1.00E+10 dyne/$cm^2$ of FIG. 3. As the temperature decreases after annealing, the tensile stress begins to change(i.e., slightly increases) at about 600° C. and becomes about 6.00E+09 dyne/$cm^2$ at about 550° C.

Figure 3:
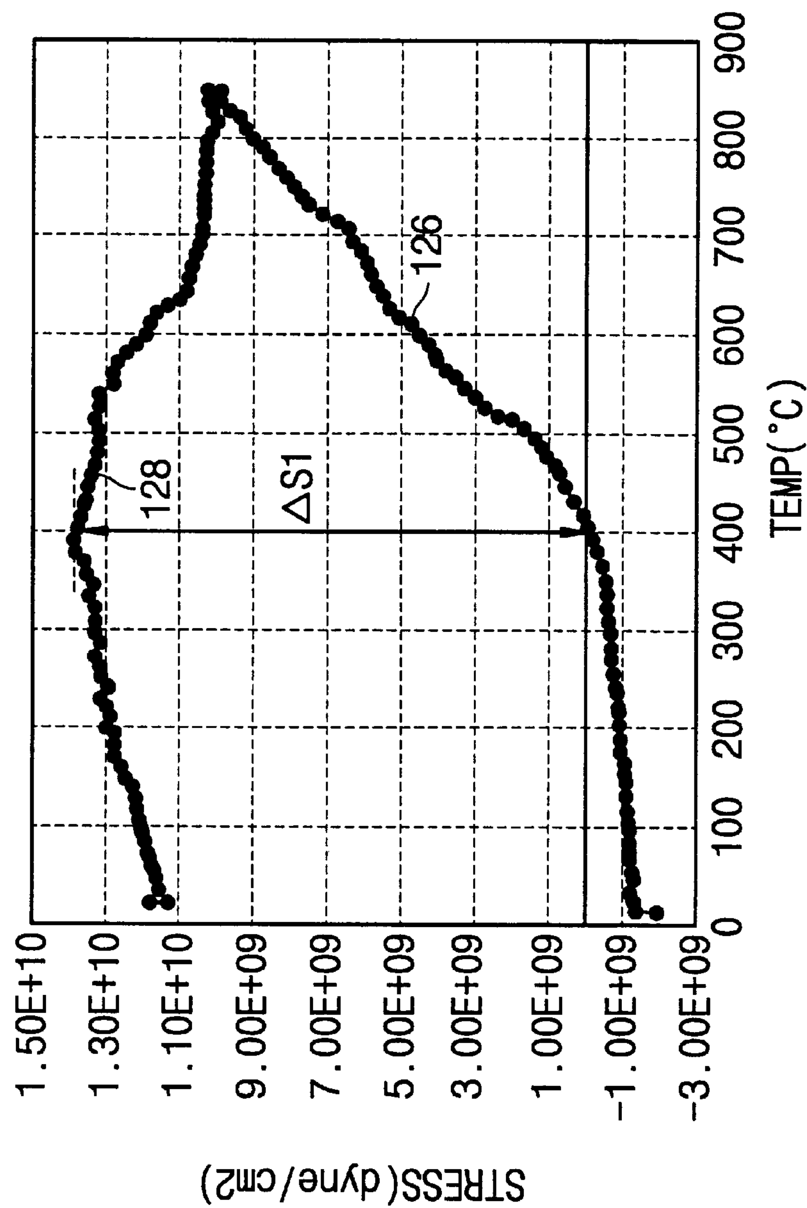
FIG. 3 schematically shows the stress variation of the conventional PE-SiN as a function of an annealing temperature.

The stress variation($\Delta$S2) at 400° C. is very small as compared to conventional stress variation ($\Delta$S1) at 400° C. of FIG. 3. Thus, the novel PE-SiN layer of the present invention is more stable than the conventional PE-SiN during an annealing process.

Figure 7:
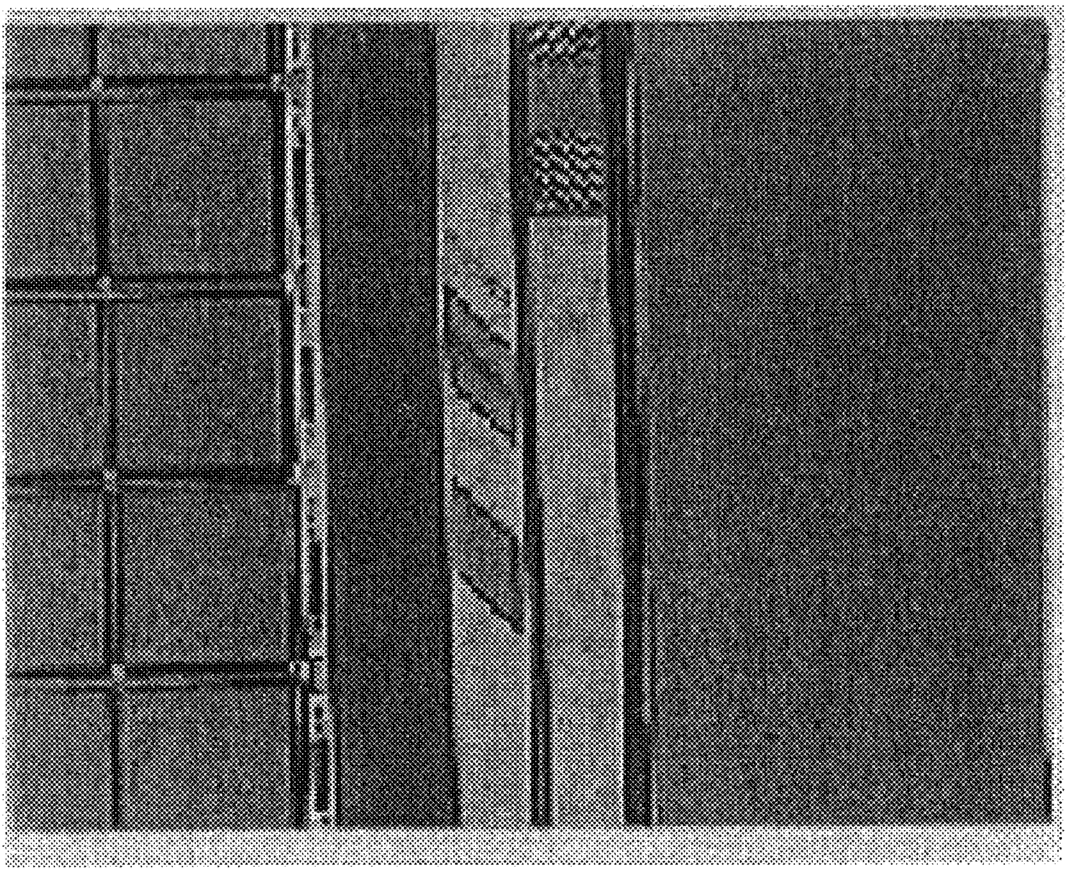
FIG. 7 is a photograph schematically showing PE-SiN without popping thereof in accordance with the present invention.

After hump annealing and gate poly oxidation processes at about 650° C. and 950° C. respectively, there is no substantial popping phenomena as shown in FIG. 7 due to the above-mentioned stress characteristics of the novel PE-SiN layer.

Figure 8A:
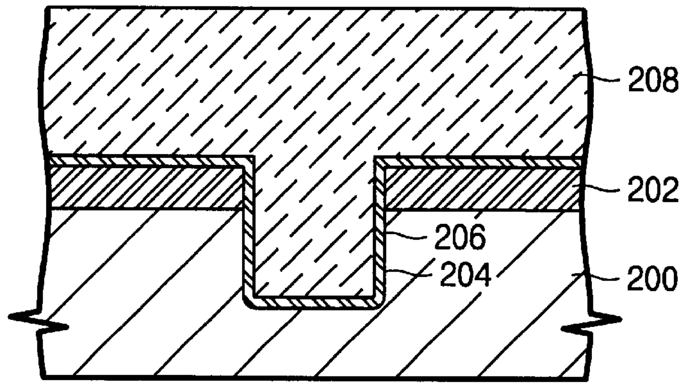
FIGS. 8A to 8C are cross-sectional views of a semiconductor substrate at selected stages of a method of forming an isolation trench in the semiconductor substrate in accordance with the present invention.
Figure 8B:
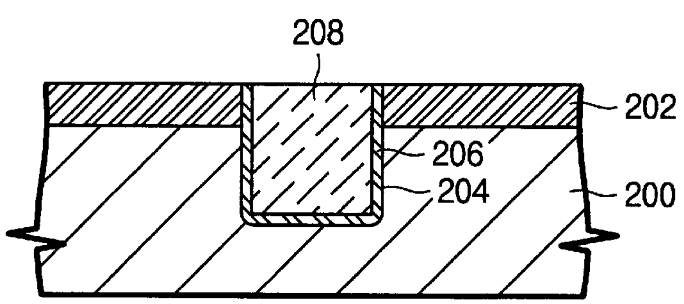
Figure 8C:
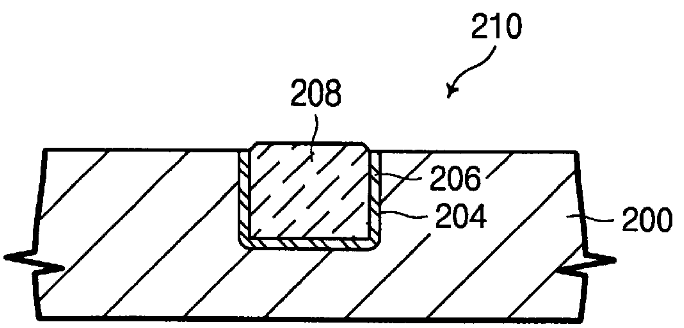

FIGS. 8A to 8C are cross-sectional views of a semiconductor substrate, at selected stages of a method of forming a trench in the semiconductor substrate using a novel PE-SiN pad nitride according to a second embodiment of the present invention.

Referring now to FIG. 8A, an etching mask 202 for defining a trench region is formed on a semiconductor substrate 200 having a pad oxide layer thereon. The etching mask 202 is made of novel PE-SiN formed in accordance with the present invention. Using the etching mask 202, the semiconductor substrate 200 is etched to form a trench 204. In order to cure etching damage, a thermal oxide is grown in the trench interior.

A trench liner 206 is formed on the thermal oxide layer to prevent oxidation of the trench interior. The liner 206 is made of a silicon nitride by LPCVD. A trench filler layer 208 is formed on the liner 206 to fill the trench. The trench filler layer 208 may be stacked layer of undoped silicate glass (USG) and PE-TEOS oxide. The PE-TEOS oxide layer serves to relieve USG stress. A densification annealing is carried out to density the trench filler layer 208. Then, the trench filler layer 208 is planarized until a top surface of the etching mask layer 202 is exposed by chemical mechanical polishing (CMP). Since the etching mask 202 is made of novel PE-SiN, the stress that is applied to the semiconductor substrate 200 by novel PE-SiN layer 202 can be reduced.

The etching mask 202 is then removed, using conventional phosphoric acid stripping, to form trench isolation 210 as shown in FIG. 8C.

The novel PE-SiN layer 202 serves to reduce the stress applied to the substrate 200 during annealing. Also, novel-PE SiN layer 202 is etched faster as compared to the liner 206 during a stripping process, thereby reducing denting the liner 206. The etching rate of novel PE-SiN 202 is about 120 angstroms/min and etching rate of the liner LP-SiN 206 is about 45 angstroms/min. The etching rate of the conventional PE-SiN is between the etching rate of novel PE-SiN and the etching rate of LP-SiN.

The present invention provides a method of forming a silicon nitride layer by a PECVD technique. The formation of the silicon nitride layer is carefully controlled so as to reduce hydrogen content. Reduced hydrogen content can provide good stress characteristics of the silicon nitride layer during annealing. Namely, the stress variation of the silicon nitride before and after deposition can be reduced.

While this invention has been particularly shown and described with reference to the preferred embodiments thereof, it will be understood by those skilled in the art that various changes in form and details may be made without departing from the spirit and scope of this invention. The present invention can be applied to all of the semiconductor manufacturing processes where PECVD of silicon nitride is part of the process.

What is claimed is:

1. A method of forming a silicon nitride layer($Si_xN_yH_z$) on a semiconductor substrate, comprising:

forming the silicon nitride layer on the substrate by a plasma enhanced chemical vapor deposition(PE-CVD), the silicon nitride layer having a hydrogen content of at most five (5) atomic percent to substantially remove a popping phenomenon.

2. The method according to claim 1, wherein the PECVD uses a silicon source gas selected from the group consisting of $SiH_4$, $Si_2H_2Cl_2$, and combinations thereof and uses a nitride source gas selected from the group consisting of $NH_3$, $N_2$, and combinations thereof.

3. The method according to claim 1, wherein the PECVD uses a mixed gas containing $SiH_4$, $NH_3$ and $N_2$ and the ratio of $SiH_4$:$NH_3$ is in the range of about 2:1 to 1:3.

4. The method according to claim 3, wherein $SiH_4$ is flowed at a rate of about 35 sccm to 60 sccm.

5. The method according to claim 1, wherein the PECVD is carried out at a power of about 300 watt to 800 watt, at a pressure of about 5 torr to 7 torr, at a temperature of about 300° C. to 600° C.

6. The method according to claim 1, wherein PECVD uses $SiH_4$ as a silicon source with a flow rate of about 20 sccm to 100 sccm and $NH_3$ as a nitride source with a flow rate of about 20 sccm to 300 sccm at a power of about 300 watt to 800 watt.

7. The method according to claim 1, wherein the silicon nitride layer is formed with a deposition rate of about 1,500 angstroms/minute.

8. The method according to claim 1, wherein the semiconductor substrate includes a material layer formed thereon, further comprising etching the silicon nitride layer and the material layer to define a gate electrode structure.

9. The method according to claim 8, wherein the material layer is made of one selected from the group consisting of a refractory metal, a refractory metal silicide and refractory metal nitride.

10. The method according to claim 8, wherein the material layer is made of one selected from a group consisting of a tungsten, tantalum, molybdenum, titanium, cobalt, tungsten silicide, tantalum silicide, molybdenum silicide, titanium silicide, cobalt silicide, tungsten nitride, tantalum nitride and titanium nitride.

11. The method according to claim 8, further comprising forming an oxide layer on the silicon nitride layer.

12. The method according to claim 11, wherein the oxide layer is made of one selected from the group consisting of high temperature oxide (HTO), PE-$SiH_4$ oxide and PE-tetraethylorthosilicate (TEOS) oxide.

13. The method according to claim 11, further comprising forming an anti-reflection layer.

14. The method according to claim 8, further comprising forming an insulating spacer on sidewalls of the etched material and silicon nitride layers.

15. The method according to claim 14, wherein the insulating spacer is made of a PECVD silicon nitride layer having a hydrogen composition of at most 0.35.

16. The method according to claim 14, wherein the insulating layer is made of a material selected from the group consisting of an LP-SiN layer and a HTO layer.

17. The method according to claim 1, wherein the semiconductor substrate includes a pad oxide layer formed thereon, further comprising etching the silicon nitride layer, the pad oxide layer and the semiconductor substrate to define a trench in the semiconductor substrate for device isolation.

18. The method according to claim 17, further comprising forming a second silicon nitride layer on the trench interior.

19. The method according to claim 18, wherein the second silicon nitride layer is formed by a low pressure chemical vapor deposition (LPCVD) technique.

20. A method of forming a silicon nitride layer($Si_xN_yH_z$) on a semiconductor substrate, comprising:

forming the silicon nitride layer on the substrate by a plasma enhanced chemical vapor deposition(PE-CVD), wherein the PECVD uses a gas mixture containing $SiH_4$, $NH_3$ and $N_2$, and wherein $SiH_4$ is flowed at a rate of about 35 sccm to 60 sccm to form the silicon nitride layer having a hydrogen composition (z) at a predetermined value of at most 0.35 so as to substantially remove a popping phenomenon.

* * * * *